United States Patent [19]

Saul

[11] Patent Number: 4,982,193
[45] Date of Patent: Jan. 1, 1991

[54] ANALOGUE TO DIGITAL CONVERSION: METHOD AND APPARATUS THEREFOR

[75] Inventor: Peter H. Saul, Northants, England

[73] Assignee: Plessey Overseas Limited, Ilford, England

[21] Appl. No.: 110,763

[22] PCT Filed: Jan. 30, 1987

[86] PCT No.: PCT/GB87/00068
§ 371 Date: Nov. 30, 1987
§ 102(e) Date: Nov. 30, 1987

[87] PCT Pub. No.: WO87/04880
PCT Pub. Date: Aug. 13, 1987

[30] Foreign Application Priority Data

Jan. 30, 1986 [GB] United Kingdom ............... 8602227
Jan. 30, 1986 [GB] United Kingdom ............... 8602230

[51] Int. Cl.$^5$ ............................................. H03M 1/36
[52] U.S. Cl. ..................................... 341/159; 341/122; 341/131; 341/155
[58] Field of Search ............... 341/122, 123, 124, 125, 341/131, 142, 156, 159, 161, 162, 95, 155

[56] References Cited

U.S. PATENT DOCUMENTS

| | | | |
|---|---|---|---|
| 3,820,111 | 6/1974 | Candy . | |
| 4,318,086 | 3/1982 | Peck et al. | 341/156 |
| 4,575,709 | 3/1986 | Tomlinson | 341/156 |
| 4,621,254 | 11/1986 | Belcher | 341/131 |
| 4,716,385 | 12/1987 | Noda et al. | 341/155 |
| 4,815,136 | 3/1989 | Benvenuto | 341/143 |

FOREIGN PATENT DOCUMENTS

| | | |
|---|---|---|
| 1532538 | 11/1978 | United Kingdom . |
| 1580178 | 11/1980 | United Kingdom . |
| 2123233 | 1/1984 | United Kingdom . |
| 2144285 | 2/1985 | United Kingdom . |

OTHER PUBLICATIONS

IEEE Int. Sol. State Ccts. Conf., Feb. 1985 (New York, U.S.), Hauser, M. W. et al., pp. 80–81, 313, "MOS ADC-Filter Combination that does not Require Precision Analog Components".
IEEE Int. Sol. State Ccts. Conf., Feb. 1980 (New York, U.S.), Black, W. C. et al., pp. 14–15, 254, "Time Interleaved Converter Arrays".

Primary Examiner—William M. Shoop, Jr.
Assistant Examiner—Gary J. Romano
Attorney, Agent, or Firm—Fleit, Jacobson, Cohn, Price, Holman & Stern

[57] ABSTRACT

A converter for digital radio applications, consisting of a parallel analogue to digital converter that provides a sampling at signal carrier frequency, or preferably at a harmonic of this frequency. Successive samples are stored in a memory and this is accessed at a lower rate to average numbers of samples. The ADC achieves greater resolution by virture of this sampling. Filtering is provided by averaging action, but further filtering functions can be performed by an add-on filter. The converter receives modulated analogue signal from an input stage, for example the rf. or if. circuit of a radio receiver. In a modified version of the apparatus, several converters may be utilized in parallel to afford increased data collection.

13 Claims, 3 Drawing Sheets

ANALOGUE TO DIGITAL CONVERSION: METHOD AND APPARATUS THEREFOR

TECHNICAL FIELD

The present invention concerns improvements in or relating to a method and apparatus for analogue-to-digital conversion most especially converters (ADC's) for digital radio applications.

The requirement for an ADC for use in a radio is particularly stringent. The dynamic range, if the ADC is used to convert the incoming signal without prefiltering, must exceed 100 db and preferably be over 130 db. This calls for accuracy of greater than 17 bits and ideally more than 22 bits.

BACKGROUND ART

In digital radio applications, such converters, hitherto, have been limited in frequency to the audio range (baseband) and have therefore been preceeded by analogue down-conversion circuitry, itself a source of error in cross- and intermodulation products of the order of −100 db, i.e. at the lowest acceptable limit for the system.

In a typical arrangement, the baseband signal is sampled at an arbitrarily high rf frequency, and, after digital conversion, a large number of digitised samples accumulated to afford improved resolution or unwanted signal rejection. Such techniques have been described in the patent literature, for example: United Kingdom Patent Applications G.B. Nos. 1,532,538; 1,580,178; 2,123,233; and, 2,144,285; U.S. patent application Ser. No. 3,820,111; and, International Patent Application W.O. No. 86/02217.

DISCLOSURE OF THE INVENTION

The present invention provides a method and an apparatus for analogue to digital conversion, adapted to offer enhanced resolution, and, suitable thus for digital radio application.

In accordance with the invention thus there is provided a method of analogue to digital conversion comprising the following steps:

acquiring a modulated analogue signal;

sampling and converting said signal, at a rate that is integer related to the carrier frequency for said signal, to generate thereby a multiplicity of digitised samples, each of n - bit word length;

selecting from said multiplicity of samples a set thereof, each sample as selected thus corresponding to a common phase but a successive cycle at said carrier frequency; and, averaging a number $2^m$ of consecutive samples of said set to generate an output word of n+m bit length.

In further accordance with the invention there is provided apparatus for analogue to digital conversion, this apparatus comprising:

input means for acquiring a modulated analogue signal;

sampling means co-operative with said input means;

clocking means, co-operative with said sampling means to operate the same at a rate that is integer related to input signal carrier frequency;

analogue to digital parallel conversion means to provide an 'n' bit digitised sample for each analogue sample;

a memory store comprised of $2^m$ memory elements each of n - bit word length;

sample selection means co-operative with both the conversion means and the memory store to direct to each element in turn a digitised sample, each sample as thus directed corresponding to a common phase but a successive cycle at said carrier frequency; and, sample averaging means, co-operative with the elements of said store, to provide an output word of n+m bit word length indicative of an average value of the $2^m$ samples stored therein.

With the provision of memory storage and averaging, n+m bit accuracy is thus attainable using only n bit conversion quantisation at front end.

The sampling means aforesaid may be incorporated as a part of the conversion means (e.g. as in a 'flash' ADC) or may be included as a dedicated sampling or sample-and-hold device.

The apparatus aforesaid may be followed by a digital filter and a digital detector. The filter may process signals either serially or in parallel if speed is requisite.

This apparatus may be applied to single sideband and amplitude modulation (AM), demodulation being performed by the action of the ADC sampling. The converter system may, with modification, also be used to process frequency modulated (FM) and frequency shift keyed (FSK) signals. Thus the sampling may be operated twice per cycle of the carrier frequency to provide in-phase and quadrature phase sampling for this purpose.

As yet further modification, the sample clock may run at a rate equal to an harmonic multiple of the selected carrier frequency, to sample thus at several samples per cycle. The data then would be fed to separate locations for respective sample phases and separate averaging performed serially or sequentially.

These and other aspects of the invention are set forth in the claims that follow hereinafter.

BRIEF INTRODUCTION OF DRAWINGS

In the drawings accompanying this specification,

DESCRIPTION OF PREFERRED EMBODIMENTS

Figure 1:
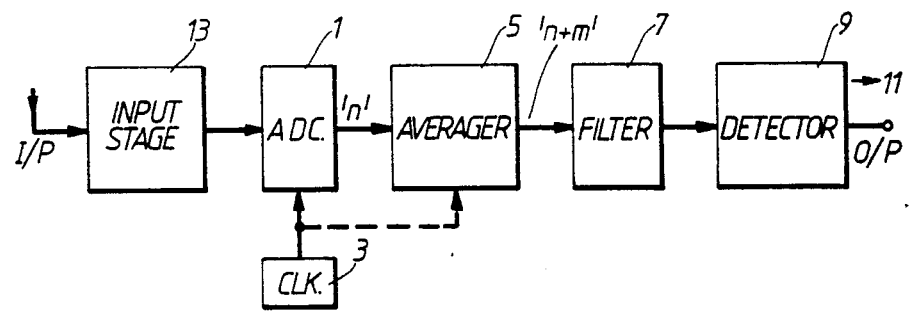
FIG. 1 is a block schematic drawing showing the arrangement of the component parts of an analogue to digital converter apparatus constructed in accord with this invention.

So that this invention may be better understood, embodiments thereof will now be described and reference will be made to the accompanying drawings. The description that follows is given by way of example only.

The ADC apparatus to be described below makes use of the essential differences between a true analogue to digital converter and the type of ADC apparatus which is acceptable in a radio application. The first of these differences is that, provided the departures from the ideal transfer characteristic are not great the main consideration is the signal-to-noise ratio rather than the existence of all states. Existing high accuracy ADCs in the baseband radio systems mentioned above and in digital telephone systems exploit this feature. The second, and possibly more important factor is that one key piece of information about the incoming wanted signal is known i.e. the frequency. It is possible to assume in modern receiver systems that a clock signal can be generated at the incoming frequency or a multiple of it with arbitrary accuracy. It is then possible to devise a radio receiver system based on the arrangement shown in FIG. 1. This shows an essentially conventional ADC 1, of the 'flash' type (which needs no sample hold), sampling at the input carrier frequency under control of a clock 3, followed by a memory and averaging circuit 5, a digital filter 7, a digital detector 9 and an output circuit 11, which could take the form of a d-a converter and audio output stage, or could be in the form of further processing circuitry for digital signals. As shown, the analogue-to-digital converter 1 directly follows the 'rf' or 'if' stage 13 of a radio receiver, from which it receives modulated analogue signal.

Figure 2:
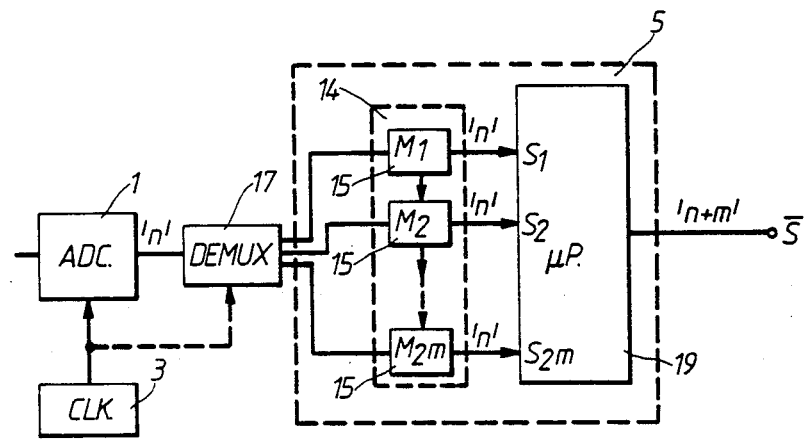
FIG. 2 is a block schematic drawing showing memory and averaging parts of the converter apparatus shown in the preceding figure.

A more detailed schematic of the ADC/memory organization is shown in FIG. 2. The memory and averaging circuit 5 shown comprises a store 14 having $2^m$ memory locations 15 each of which is of n - bit word length and is loaded sequentially by demultiplexing 17 the output from the ADC 1. Once loaded, each memory location 15 is read by microprocessor or other averaging circuitry 19 and an n+m bit word length signal generated at the circuitry output.

The ADC 1 could be essentially a conventional parallel "flash" type, of eight or more bits 'n'. It would preferably have a wide analogue input bandwith to accommodate signals up to or above the top of the HF band (30 MHz). With some compromise in performance, fewer than eight bits could be used; this may be more attractive at V.H.F.

Figure 3:
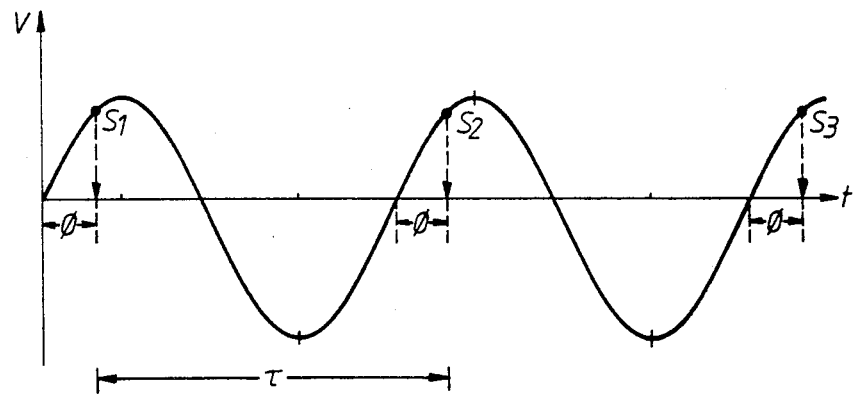
FIG. 3 is an amplitude versus time graph showing synchronous of a modulated signal waveform.

The clock 3 in this simplest system is synchronous with the nominal input carrier frequency. Hence, successive samples $S_1; S_2; \ldots$, occur at equal time intervals on the carrier waveform (see FIG. 3). If therefore a number of successive samples $S_1; S_2; \ldots$, are stored and subsequently averaged, then the average value S will represent further bits of resolution in the equivalent ADC. For example, if "$2^m$" samples $S_1; S_2; \ldots ; S_2m$, are averaged, then "m" further bits of resolution will be obtained. The averaging would most advantageously be a "rolling" arrangement, with the oldest samples $S_1$, etc., being discarded in favour of new values $S_{2m+1}$, etc. In the simplest case, a level weighting would be imposed, but for increased output bandwidth it would be possible to weight the average S to the newest samples ($\bar{S} = \Sigma_i \omega_i S_i$).

The total of "n+m" bits are then passed to a digital filter, which can be of many different forms: generic classes are "finite impulse response" (FIR) and "infinite impulse response" (IIR). The filtering provides, in addition to the inherent filtering to be described below, the selectivity of the receiver.

Figure 7:
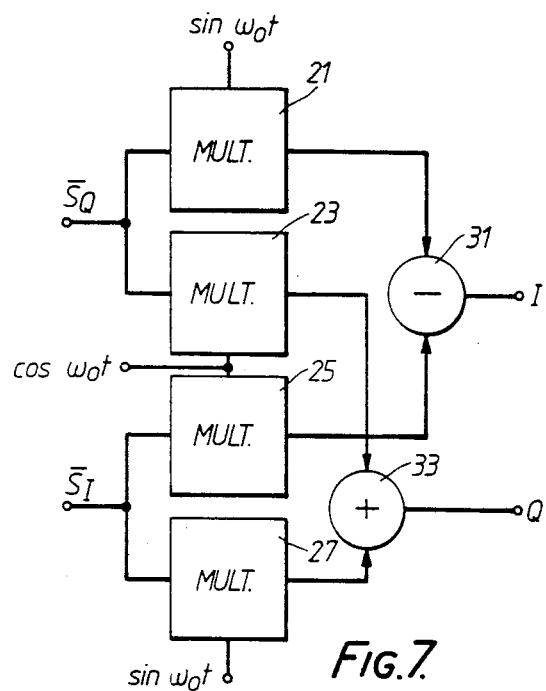

The composite ADC apparatus FIG. 1, can be used to receive all classes of modulation by providing a suitable digital detector. Single sideband and amplitude modulation will be demodulated by the action of the ADC sampling. If necessary a phase control (not shown) may be included to prevent sampling at zero-crossing points. Frequency modulation, or FSK can be demodulated using a phase and quadrature receiver of appropriate chacteristics, for example the receiver described in our United Kingdom patent application G.B. No. 8602227, brief details of which will follow below (FIG. 7). This leads to a modification of the scheme which may be generally advantageous. A phase shift at the carrier frequency is needed for the FM demodulator cited and for certain others. This is achieved in the ADC apparatus described here FIG. 1 by providing two clock pulses to the ADC 1, with a 90 degree (i.e. quadrature) relative phase shift. Data is then sorted in two separate (phase and quadrature, or I and Q) memories 14. The derived n+m bits can then be processed through the filter by time interleaving, or could be passed through two separate filters for maximum speed. Again, for maximum speed of operation, two phased ADCs 1 could be used, but this would slightly degrade the I and Q channel matching.

The phase and gradrature receiver circuit shown in FIG. 7 comprises four digital multipliers 21, 23, 25 and 27, a difference amplifier 31 and a running amplifier 33. The multipliers are arranged in pairs 21 and 23, 25 and 27 and are connected to receive the averaged sample outputs $\bar{S}_Q$ and $\bar{S}_I$ of the conversion apparatus, respectively. One multiplier 21, 27 in each pair receives an in-phase multiplicand, $\sin \omega_o t$, whilst the other multiplier 23, 25 in each pair receives a quadrature multiplicand, $\cos \omega_o t$. The output of each multiplier 21, 25 and 23, 27 is referred to the difference amplifier 31 and to the summing amplifier 33, respectively to generate in-phase I and quadrature Q detected digital signals.

Returning to consider the ADC system FIG. 1, several limitations can be identified. These are not major problems, but delineate the likely limits to operation. The most obvious limit is that the sample rate and hence the incoming frequency must exceed $2^m \times$(maximum modulation frequency$\times 2$) to allow for two samples per cycle of the modulation from $2^m$ successive samples of the carrier. An example would be for the averaging of 1024 samples (m=10) with 2 kHz modulation, leading to a minimum input of 4 MHz. With a 10 bit ADC this would give 120 db dynamic range.

Figure 4:
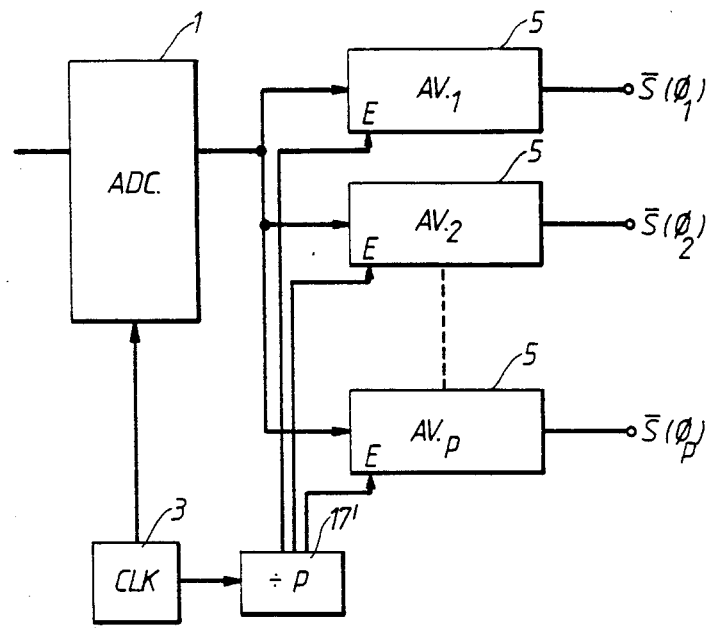
FIG. 4 is a block schematic drawing of apparatus, an extension of that shown in FIG. 2, adapted for multi-phase sampling.
Figure 5:
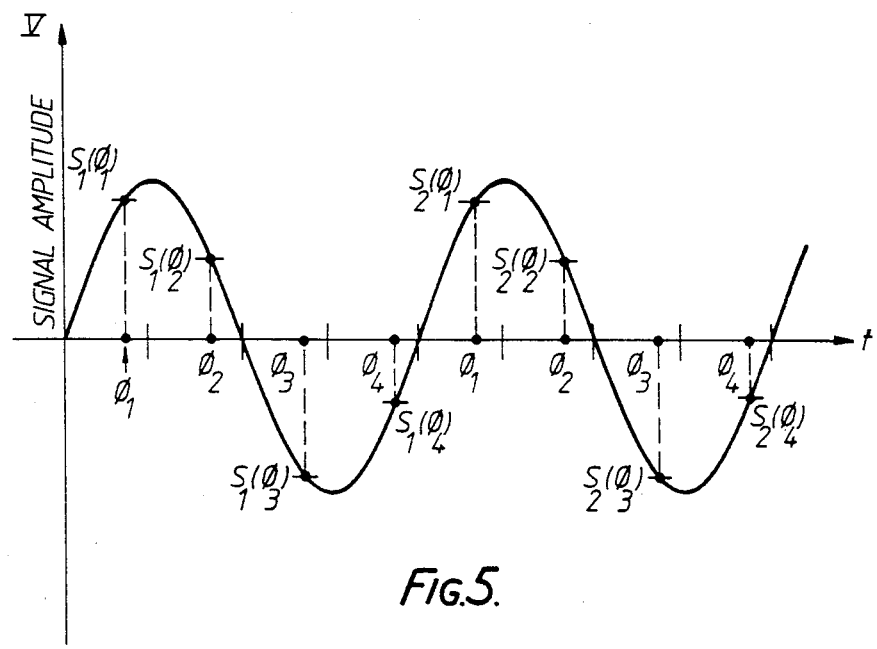
FIG. 5 is an amplitude versus time graph showing 4:1 oversampling of a modulated signal waveform.
Figure 6:
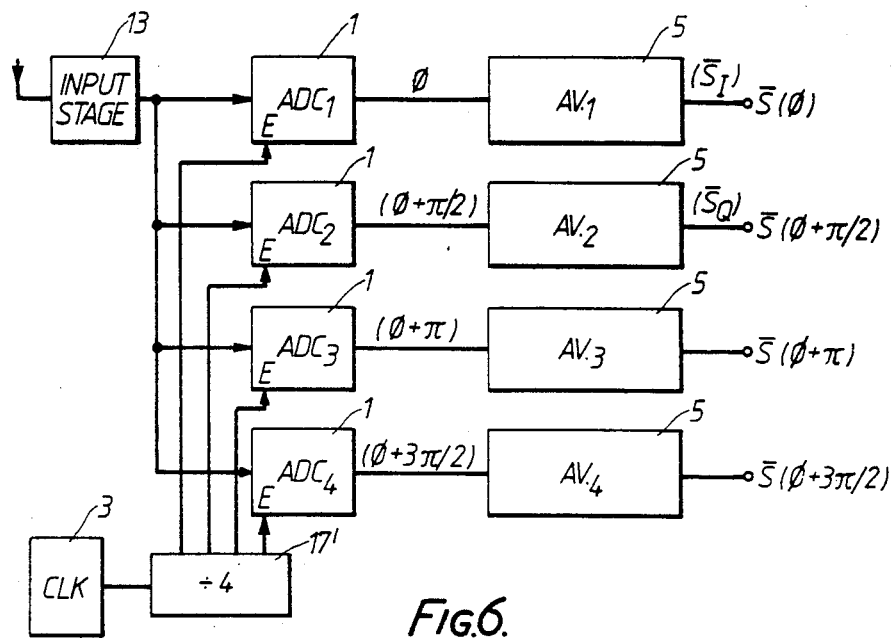
FIG. 6 is a block schematic drawing of apparatus, a variant of that shown in FIG. 4; and, FIG. 7 is a block schematic drawing of a phase and quadrature receiver circuit, one that may be added to the multi-phase conversion apparatus of FIGS. 4 or 6.

Unusually for an ADC system there is also a minimum for the modulation frequency, below which the coarse initial quantisation will become more evident. This limit occurs when the slew rate of the input modulation is such that only a small fraction of the averaged samples in a quantisation level is distinguishable from the main group of samples. A closely related limit occurs when the input signal is so small that it always remains at a single quantisation level of the coarse ADC 1. However, these are only a problem if there is no other interfering signal present which can carry the input to an adjacent level, at least for part of the time. The interfering signals, which in practical systems will always be present, can be filtered out in the subsequent stages. The ultimate dynamic range is therefore limited by the combination of "n" and "m" achievable. It has been shown above that, at low frequencies, for a 10 bit ADC, $2^{10}$ memory locations are required. Raising the signal/sample rate would ease the ADC requirement, at the cost of more memory. Clearly, current state of art systems can barely achieve the required dynamic range. While it is to be expected that developed systems will eventually achieve larger numbers of bits ("n") resolution, one further modification to the described arrangement (FIG. 1) could remove the limitations due to finite word length in the ADC 1 by applying more memory 14 and processing 19. Since memory and digital processing power continues to fall in cost this is an advantageous route. This modification is to provide multiple samples $S(\phi_1); S(\phi_2); \ldots S(\phi_p)$, per cycle of the carrier signal. These could be provided by a single ADC 1 (FIG. 4) sampled at a higher frequency, or, by several phased ADCs 1 (FIG. 6) if speed is a limitation. The data is then fed to a memory array, with separate stores 14 for respective sample phases $\phi_1; \phi_2; \ldots \phi_p$. Averaging is carried out as before, but based on "p" separate samples $S(\phi_1)$ to $S(\phi_p)$ per cycle. An example of "p"=4 is shown in FIG. 5.

Filtering is again speed dependent. Fast systems (in relation to available processing speed) will use parallel digital filters, while slower systems may use the same filter 7 on a time-multiplexed basis. Data is then stored in a further memory (not shown) for sequential reconstruction. Essentially, the memories are polled at a rate which is either a submultiple of the original sample rate or is a multiple (at least twice) of the maximum output frequency. The output, after d/a conversion, is the recovered modulation. Again SSB, AM, FM or FSK modes are possible. The two sample per cycle method for FM detection described above is clearly one case of the more general p-sample system just described.

A particular advantage of the multiple sampling scheme is that the filter 7 at the output frequency consists of several identical sections. These can be strictly separate filters for each successive sample interval. To great advantage, however, a single filter section instead could be used on a time multiplexed basis. The several section version of the filter has an analogue in the class of filters known as "N-path". The sequential version could be regarded as a special case of "N-path" filtering.

Accuracy limitations of the basic ADC 1 form one limit of the cross and intermodulation characteristics of the system. The most obvious limit is the finite accuracy of the steps in the ADC 1 transfer characteristic. However, since most of the steps are much more accurate than the worst case error, the dynamic range limitation due to this source of error is likely to be much better than the quantisation term of 6 db per bit. Taking the 10 bit example above, the dynamic range for a practical system would substantially exceed (n×6) i.e. 60 db and would probably be over 100 db, although this figure is difficult to quantify without precise knowledge of the types of ADC errors and a further study of their effects. Prefiltering of the R.F. signal may be necessary in some applications where significant signals are present at harmonics of the wanted signal. A higher degree of oversampling would in principle help here, but the sample rate would then need to be synchronous with the input and at a frequency at least twice that of the highest possible received frequency. The input would still need anti-alias low-pass input filtering, so each case should be considered on its merits. Prefiltering is commonly used in analogue systems and the requirement is only for a reduction in the harmonics of the received frequency; adjacent channel filtering is carried out by the digital system. The apparatus described above may be assembled from standard components. Thus, for example, it could be assembled using a Plessey SP9758 8-bit ECL - ADC; Plessey HA21 random access memories; and, averaging circuits constructed from small-scale integration (SSI) logic gates such as Plessey ECL III series devices.

From the foregoing description, the following advantageous features will be evident:

(i) The inventive apparatus herein disclosed, incorporated as part of a digital radio receiver, offers wideband input capability;

(ii) The apparatus, in general, requires little or no prefiltering;

(iii) It is capable of integration onto a small number only of integrated circuits;

(iv) Elaborate set-up procedures are unnecessary during system production;

(v) It may be devised for AM, SSB, ISB or FM mode operation and is suited to software control;

(vi) Associated filtering functions, as may be requisite, likewise can be readily implimented under software control; and, (vii) The system offers the capability of wide dynamic range performance.

I claim:

1. A method of analogue to digital conversion comprising the following steps:
   acquiring a modulated analogue signal;
   sampling and converting said signal, at a rate that is integer related to the carrier frequency for said signal, to generate thereby a multiplicity of digitised samples each of n - bit word length;
   selecting from said multiplicity of samples a set thereof, each set of samples
   as selected thus corresponding to a common phase but successive cycles at said carrier frequency; and,
   averaging a number $2^m$ of consecutive samples of said set to generate an output word of n+m bit length.

2. A method, as claimed in claim 1, wherein the steps of selection and averaging are performed repeatedly, to generate a string of output words each of n+m bit length, and such that on each repeat said set of selected samples includes a given number of the samples selected on the previous repeat.

3. A method, as claimed in claim 1, wherein said sampling and converting step is performed at a rate that is an harmonic multiple of the carrier frequency, the multiplicity of digitised samples generated thus including samples of different carrier frequency phase; and, the steps of selection and averaging are performed for a plurality of sample sets each set corresponding to a respective different phase at carrier frequency.

4. A method, as claimed in claim 3, wherein said sampling and converting step is performed at a rate that is the fourth harmonic of the carrier frequency, said sample sets corresponding to phases that differ by inphase and quadrature term output words being generated.

5. Apparatus for for converting an analogue signal to a digital signal comprising:
   input means for acquiring a modulated analogue signal;
   sampling means co-operative with said input means;
   clocking means co-operative with said sampling means to operate the sampling means at a rate that is integer related to input signal carrier frequency;
   analogue to digital parallel conversion means to provide an 'n' bit digitised sample for each analogue sample;
   a memory store comprised of $2^m$ memory elements each of n - bit word length;
   sample selection means co-operative with both the conversion means and the memory store to direct to each element in turn a digitised sample, each sample as thus directed corresponding to a common phase but a successive cycle at said carrier frequency; and, sample averaging means co-operative with the elements of said store to provide an output word of n+m bit word length indicative of an average value of the $2^m$ samples stored therein.

6. Apparatus, as claimed in claim 5, wherein:

said sample selection means is adapted to address each element of said store in a cyclic manner; and, said sample averaging means is controlled to provide output words repeatedly, each word corresponding to a consecutive 'rolled' set of the digitised samples stored in the $2^m$ elements of said store.

7. Apparatus, as claimed in claim 5 wherein:

said averaging means is adapted to weight the $2^m$ samples stored in the memory store, the most recent thereof being accorded highest weighting.

8. Apparatus as claimed in claim 5 wherein the clocking means is co-operative with said sampling means to operate the same at a rate that is an harmonic multiple of the input signal carrier frequency;

a plurality of memory stores being provided, each comprised of $2^m$ memory elements;

said selection means being arranged each set being extracted for a different respective phase of the carrier frequency; and, said sample averaging means being co-operative with each store to provide an output word for each respective phase.

9. Apparatus, as claimed in claim 8, wherein the rate is the fourth harmonic of the carrier frequency, so that in-phase and quadrature term words shall be presented at output.

10. Apparatus, as claimed in claim 8 including a time multiplexed filter connected to the output of the sample averaging means.

11. Apparatus for converting an analogue signal to a digital signal comprising:

input means for acquiring a modulated analogue signal;

sampling means co-operative with said input means;

clocking means co-operative with said sampling means to operate the sampling means at a rate that is integer related to and is a harmonic multiple of the input signal carrier frequency;

analogue to digital parallel conversion means to provide an 'n' bit digitised sample for each analogue sample;

a plurality of memory stores comprised of $2^m$ memory elements each of n - bit word length, said analogue to digital conversion means comprises a plurality of phased parallel converters said plurality of stores being of like number, each converter being co-operative with a respective one of said stores;

sample selection means co-operative with both the conversion means and the said memory stores to direct to each element in turn a digitised sample, each sample as thus directed corresponding to a common phase but a successive cycle at said carrier frequency, said sample selection means being arranged to direct to respective stores sets of digitized samples, each set being extracted for a different respective phase of the carrier; and sample averaging means co-operative with the elements of said memory stores to provide an output word of n+m bit word length indicative of an average value of the $2^m$ samples stored therein, said sample averaging means being co-operative with each store to provide an output word for each respective phase.

12. Apparatus as claimed in claim 9, in combination with a phase and quadrature digital receiver the inputs of which are connected to receive the in-phase and quadrature term output words.

13. Apparatus, as claimed in claim 12, wherein said receiver comprises:

four digital multipliers;

a difference amplifier and, a summing amplifier wherein, first and second of these multipliers are connected at input to receive the quadrature term word and are connected at output to the difference and summing amplifiers respectively;

third and fourth of these multipliers are connected at input to receive the in-phase term word are likewise connected at output to the difference and summing amplifiers respectively; and, in-phase and quadrature multiplicands are applied to the first and fourth multipliers and to the second and third multipliers respectively.

* * * * *